(12) United States Patent
Bazarsky et al.

(10) Patent No.: US 12,183,386 B2
(45) Date of Patent: Dec. 31, 2024

(54) OPTIMIZATION OF NON-ALIGNED HOST WRITES

(71) Applicant: Western Digital Technologies, Inc., San Jose, CA (US)

(72) Inventors: Alexander Bazarsky, Holon (IL); Judah Gamliel Hahn, Ofra (IL); Michael Ionin, Rehovot (IL)

(73) Assignee: Sandisk Technologies, Inc., Milpitas, CA (US)

( * ) Notice: Subject to any disclaimer, the term of this patent is extended or adjusted under 35 U.S.C. 154(b) by 177 days.

(21) Appl. No.: 17/903,750

(22) Filed: Sep. 6, 2022

(65) Prior Publication Data

US 2024/0079045 A1    Mar. 7, 2024

(51) Int. Cl.
*G11C 11/408* (2006.01)
*G11C 11/406* (2006.01)
*G11C 11/56* (2006.01)

(52) U.S. Cl.
CPC .... *G11C 11/4085* (2013.01); *G11C 11/40607* (2013.01); *G11C 11/5628* (2013.01)

(58) Field of Classification Search
CPC ... G11C 11/4085; G11C 11/40; G11C 11/408; G11C 11/56; G11C 11/406
USPC .................................................. 365/230.06
See application file for complete search history.

(56) References Cited

U.S. PATENT DOCUMENTS

| | | | |
|---|---|---|---|
| 8,521,947 B2 | 8/2013 | Su et al. | |
| 9,529,707 B2 | 12/2016 | Nakamura et al. | |
| 9,922,039 B1 | 3/2018 | Armangau et al. | |
| 10,372,603 B2 | 8/2019 | Muthiah et al. | |
| 10,853,238 B2 | 12/2020 | Palmer | |
| 11,934,695 B2 * | 3/2024 | Chandramani | G06F 3/0673 |
| 2009/0157964 A1 | 6/2009 | Kasorla et al. | |
| 2010/0153636 A1 | 6/2010 | Huang et al. | |
| 2012/0284587 A1 * | 11/2012 | Yu | G06F 12/0868 711/E12.008 |
| 2013/0091327 A1 * | 4/2013 | Shido | G11C 11/4096 711/114 |
| 2013/0132660 A1 | 5/2013 | Li et al. | |
| 2019/0163620 A1 * | 5/2019 | Muthiah | G06F 9/3013 |
| 2020/0117397 A1 | 4/2020 | Li et al. | |
| 2021/0216399 A1 * | 7/2021 | Zhang | G06F 11/1068 |

* cited by examiner

*Primary Examiner* — Muna A Techane
(74) *Attorney, Agent, or Firm* — PATTERSON + SHERIDAN, LLP

(57) ABSTRACT

The present disclosure generally relates to aligning non-aligned data for more efficient data reading. Data for write commands does not always perfectly align, yet the data is written in order of write command receipt. In such cases, aligned chunks of data may be split into two word lines (WLs) due to the presence of previously received smaller chunks of data. Rather than writing the data in order, the smaller chunks of data, which are non-aligned, are held in a buffer and written later to ensure that any aligned chunks of data remain aligned when written to the memory device. Once sufficient smaller chunks or data have accumulated to be aligned, or upon a need to write the smaller chunks upon reaching a threshold, the smaller chunks are written together in a single WL so as to not cause non-alignment of aligned data.

20 Claims, 8 Drawing Sheets

200

| | | |
|---|---|---|
| Jumbo WL #1 | NON-ALIGNED DATA 206 | ALIGNED DATA 202 |
| Jumbo WL #2 | ALIGNED DATA 204 | |

OPTIMIZATION OF NON-ALIGNED HOST WRITES

BACKGROUND OF THE DISCLOSURE

Field of the Disclosure

Embodiments of the present disclosure generally relate to aligning non-aligned data for more efficient data reading.

Description of the Related Art

When host devices write data to data storage devices, the data may be in different patterns. Some problematic patterns include writing a small data chunk, such as 1 flash management unit (FMU) or 4 KB followed by a long data sequence. Ideally, long sequential data is written aligned to flash word lines (WLs) and read quickly in parallel. A flash WL may, for example, be 8 dies long such as about 128 KB.

In current architectures, the small data chunk (e.g., 1 FMU) is not written separately, but rather, takes up a small portion of a WL causing the long data sequence, which is written after the small data chunk, to be written unaligned to WLs. In this scenario, when the host device then reads a (for example) 128 KB data chunk such as the long data sequence, the read would be spread to 2 WLs instead of 1 WL due to the presence of the short data chunk and majority of the long data sequence being in the same WL. If the long data sequence had arrived prior to the short data chunk, the long data sequence would have been written first and occupy only 1 WL when there would be no preceding FMU (i.e., not small data chunk written first). Reading two WLs for data that would fit on a single WL has a performance impact, which can be significant in certain benchmarks. Windows primary drive, for example, doesn't use streams and may initiate such small write chunks as part of different logs.

While the small data chunk of non-aligned data may fit with a long data sequence of aligned data in a single WL because of the order the command was sent, it causes any additional aligned data to be pushed to the next WL. This then causes the device to read more than one WL. The need to read an additional word line because all aligned data is not together on one word line causes latency issue. Furthermore, the need to read multiple word lines with both non-aligned data and aligned data will cause performance issues.

Therefore, there is a need in the art for improved writing to enable more efficient read operations.

SUMMARY OF THE DISCLOSURE

The present disclosure generally relates to aligning non-aligned data for more efficient data reading. Data for write commands does not always perfectly align, yet the data is written in order of write command receipt. In such cases, aligned chunks of data may be split into two word lines (WLs) due to the presence of previously received smaller chunks of data. Rather than writing the data in order, the smaller chunks of data, which are non-aligned, are held in a buffer and written later to ensure that any aligned chunks of data remain aligned when written to the memory device. Once sufficient smaller chunks or data have accumulated to be aligned, or upon a need to write the smaller chunks upon reaching a threshold, the smaller chunks are written together in a single WL so as to not cause non-alignment of aligned data.

In one embodiment, a data storage device comprises: a memory device; and a controller coupled to the memory device, wherein the controller is configured to: accumulate data to be written to the memory device in a write buffer; determine whether a current write pattern fits aligned after non-aligned write; rearrange the data to align with a word line; and write the data to the memory device.

In another embodiment, a data storage device comprises: a memory device; and a controller coupled to the memory device, wherein the controller is configured to: detect a read pattern on two word lines that fits aligned after non-aligned read; schedule re-alignment on the two word lines; and re-align the two word lines on the memory device.

In another embodiment, a data storage device comprises: memory means; and a controller coupled to the memory means, wherein the controller is configured to: determine that either a write pattern or a read pattern is not-aligned; re-align data associated with the write pattern or the read pattern; and write the re-aligned data to the memory means.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to aligning non-aligned data for more efficient data reading. Data for write commands does not always perfectly align, yet the data is written in order of write command receipt. In such cases, aligned chunks of data may be split into two word lines (WLs) due to the presence of previously received smaller chunks of data. Rather than writing the data in order, the smaller chunks of data, which are non-aligned, are held in a buffer and written later to ensure that any aligned chunks of data remain aligned when written to the memory device. Once sufficient smaller chunks or data have accumulated to be aligned, or upon a need to write the smaller chunks upon reaching a threshold, the smaller chunks are written together in a single WL so as to not cause non-alignment of aligned data.

Figure 1:
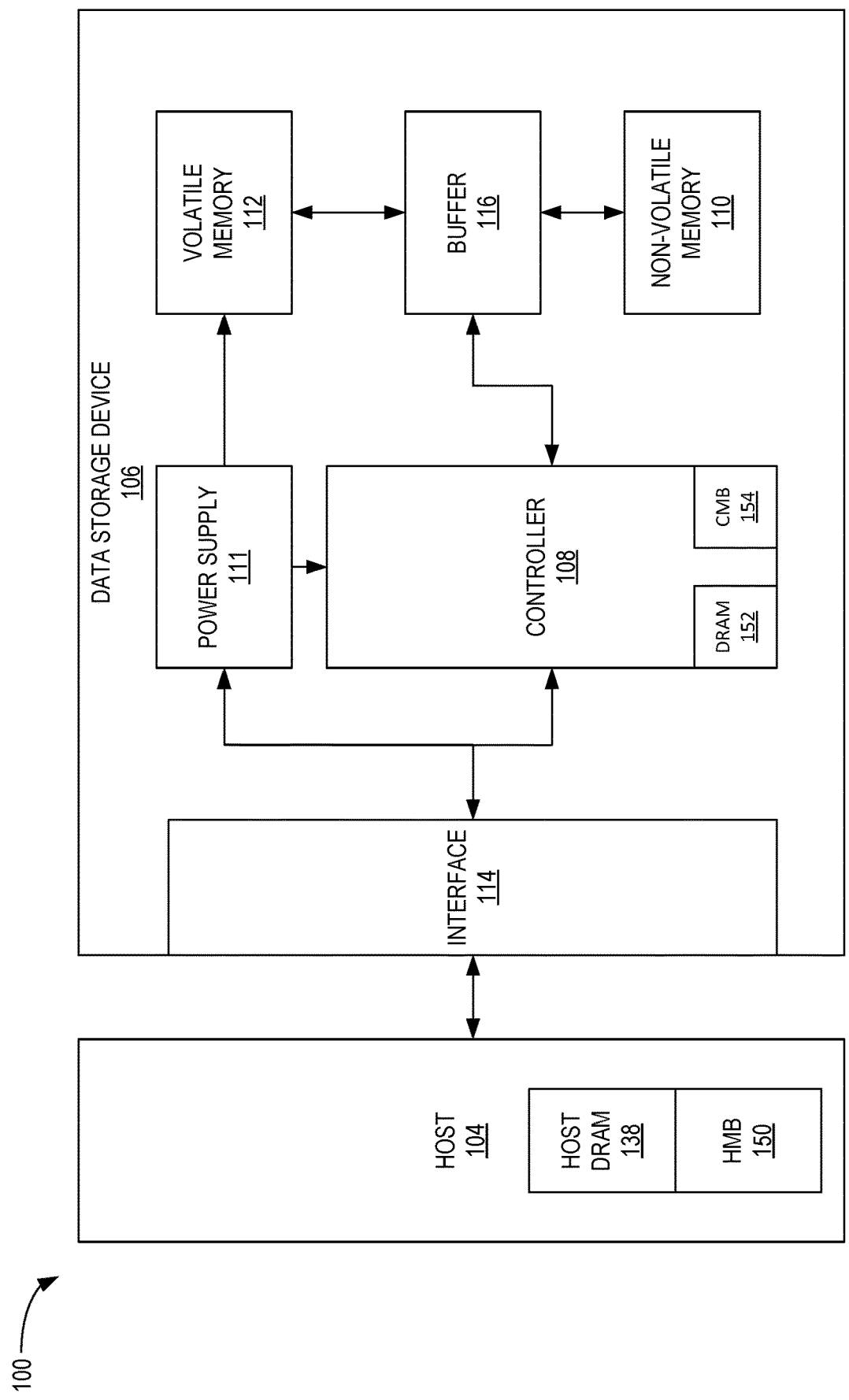
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138 and, optionally, a host memory buffer 150. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. The controller 108 may include volatile memory such as DRAM 152 as well as a controller memory buffer (CMB) dedicated for host device 104 usage. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in an internal memory of the controller 108 (i.e., a second volatile memory), which may be SRAM memory, prior to sending the data to the NVM 110.

Figure 2:
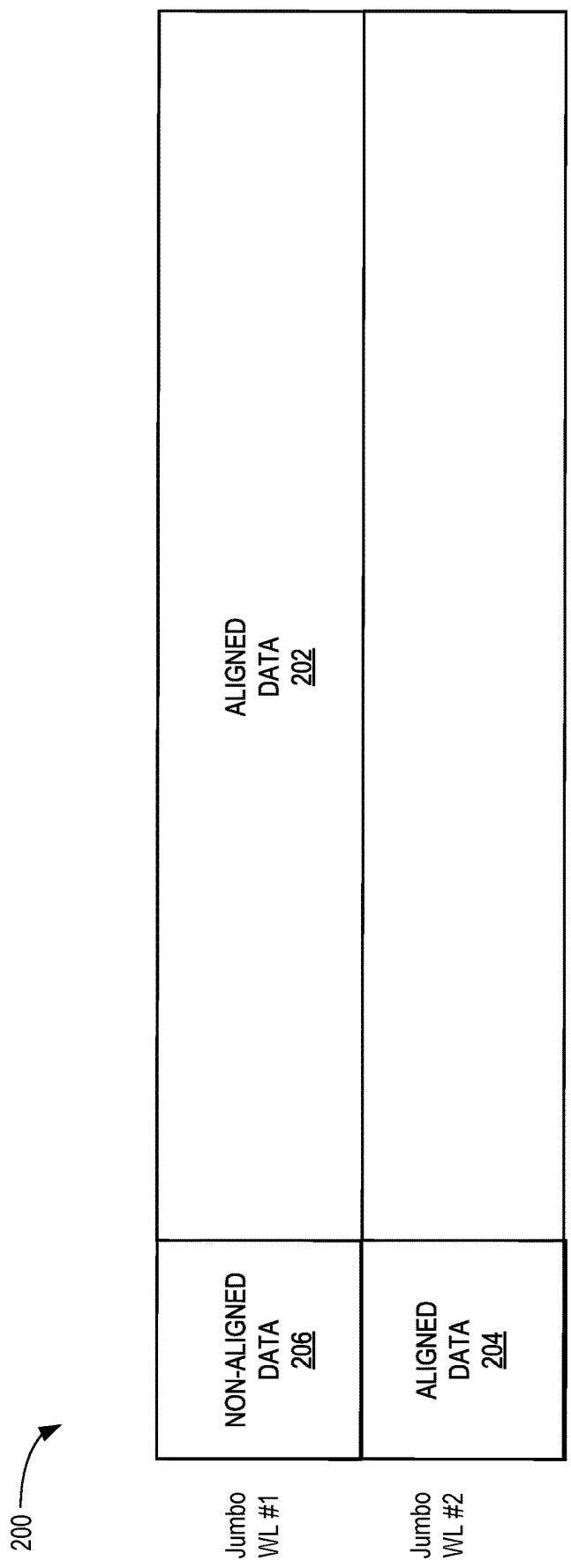
FIG. 2 is a schematic illustration of data of two consecutive write commands written to jumbo word lines (WLs).

FIG. 2 is a schematic illustration 200 of data of two consecutive write commands written to jumbo word lines (WLs). FIG. 2 shows the described result of a write command with a long "aligned" data chunk and a small data chunk non-aligned assuming the size of the entire Jumbo WL (WL across several dies read in parallel) is 128 KB.

A small data chunk is also referred to as the non-aligned data 206 is shown in Jumbo WL #1, while long "aligned" data chunk also referred to as the aligned data 202 is shown in Jumbo WL #1 as well. Aligned data 204 is a small chunk of data that is shown in Jumbo WL #2. In this example aligned data 204 spills over to Jumbo WL #2 since Jumbo WL #1 only has space for 128 KB. Collectively, aligned data 202 and aligned data 204 are part of the same chunk of data to be written that, if kept together, would have been aligned, but now as written is not aligned.

The first portion of the Jumbo WL is occupied by the non-aligned data 206 and the aligned data 202. Aligned data 204 and non-aligned data 206 are the same size. Since the aligned data 204 and non-aligned data 206 are equal in size, the non-aligned data 206 is able to fit on Jumbo WL #1 with aligned data 202. This then causes the aligned data 204 of the original data chunk to move to Jumbo WL #2, which will require reading 2 Jumbo WL's when read by the host. This incurs a random read performance and quality of service (QoS) impact.

As discussed herein, a method is disclosed to identify small non-aligned host writes and avoid writing the small non-aligned host writes to the NAND to the same WLs as aligned longer host writes, but rather do some manipulation to either group the non-aligned host writes together or write the non-aligned host writes separately. This method relates to operations done before writing the data to NAND or to operations done to relocate some data after the data was written. The approach will increase performance in certain use cases that are common in important benchmarks and may improve the user experience.

In some embodiments, there is a hardware module in the data storage device controller that accumulates data until the data is ready to be written to the memory device (e.g., NAND). The operation is broadly described in FIG. 3. The buffer in the storage controller accumulates data until the data is ready to be written to NAND or a Flush command that specifically indicates to write all the non-written data sent by the host to the NAND regardless of buffer state.

Figure 3:
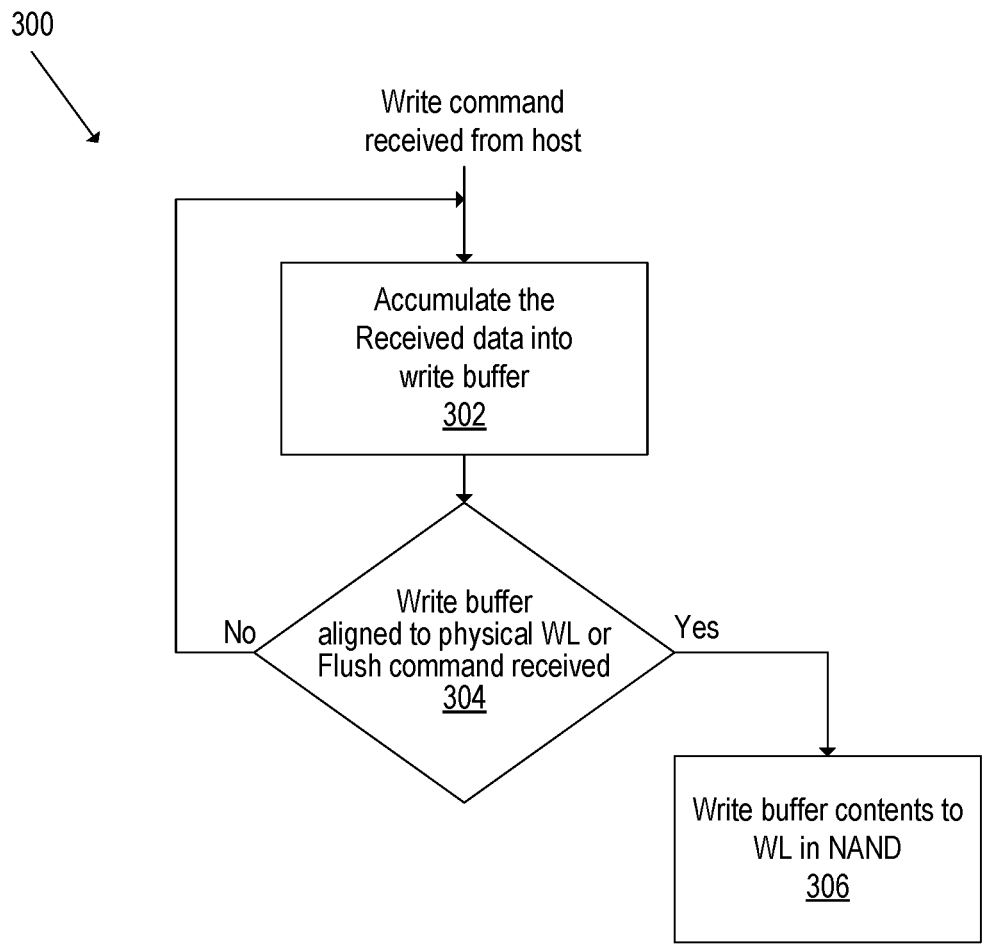
FIG. 3 is a flowchart illustrating write operations for handling write commands according to one embodiment.

FIG. 3 is a flowchart 300 illustrating a write command that is received from the host device for operations for handling write commands according to one embodiment. In block 302, the write buffer will accumulate all the received data to then be written to the Jumbo WLs when there is enough data aggregated. The received data will be a combination of non-aligned data and aligned data. The inefficiency will be present and felt in read benchmarks when short random reads, such as non-aligned data 206 that can potentially fit into a single WL (like 128 KB) with aligned data such as aligned data 202, are non-aligned in the Flash due to the short non-aligned write as described.

In block 304 the write buffer is aligned to determine whether the data is ready to be written to the physical WL of the NAND or if a flush command is received that specifically indicates to write all the non-written data sent by the host to the NAND regardless of the buffer state. If the data is not ready to be written then the process returns to block 302. If the data is ready to be written, or if a flush command is received then the process proceeds to block 306 where the contents of the buffer are written to the WL in the NAND.

It should be noted that NVMe does have features which can provide guidance to the host about ideal alignment, granularity, and transfer size for both read and write operations. However, client environments typically do not perform any optimization based on these parameters. In the context of this disclosure, the parameters may have been provided to the host, but the host is free to ignore them.

Figure 4:
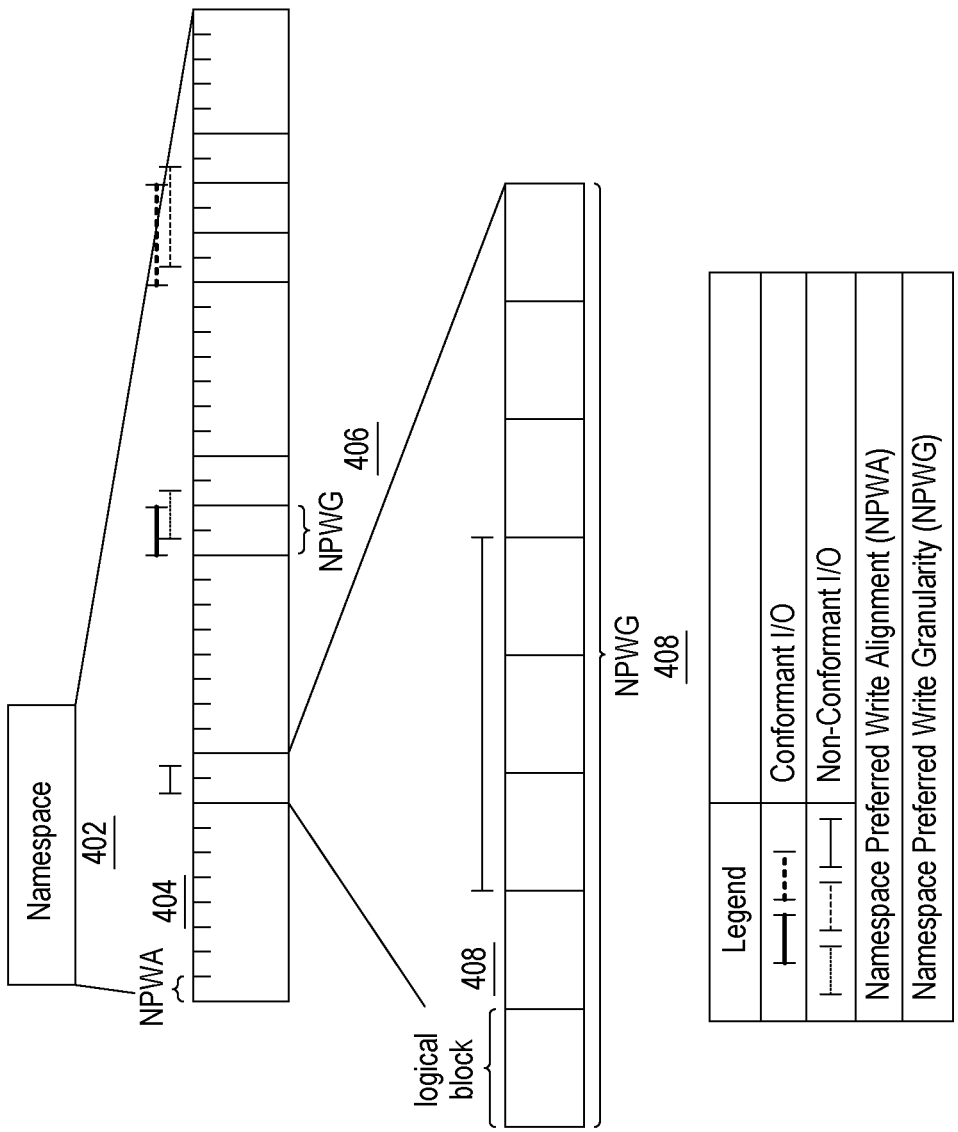
FIG. 4 is a schematic illustration of namespace alignment parameters in non-volatile memory express (NVMe) according to one embodiment.

In the example shown in FIG. 4, the writes marked as "non-conformant I/O" are not optimized in the current art. This disclosure provides ways to optimize these writes. FIG. 4 is a schematic illustration of namespace alignment parameters in non-volatile memory express (NVMe) according to one embodiment.

In this embodiment a namespace comprises a Namespace Preferred Write Alignment (NPWA) and a Namespace Preferred Write Granularity (NPWG). The NPWG comprises a plurality of logical blocks.

As described herein, methods are disclosed to identify and handle the scenario of short non-aligned data interfering with long aligned data write segments. The embodiments herein will significantly improve QoS and read performance in low queue depth reads that include this scenario. The described identification can be conducted either before writing the problematic data such as non-aligned data to the NAND inside the controller, or after the data is read inefficiently due to the "non-alignment" of the segment. The non-aligned data can be detected after the data has been written to a Jumbo WL with aligned data on that same Jumbo WL or the non-aligned data can be detected before the non-aligned data and the aligned data are written to the same Jumbo WL.

Figure 5:
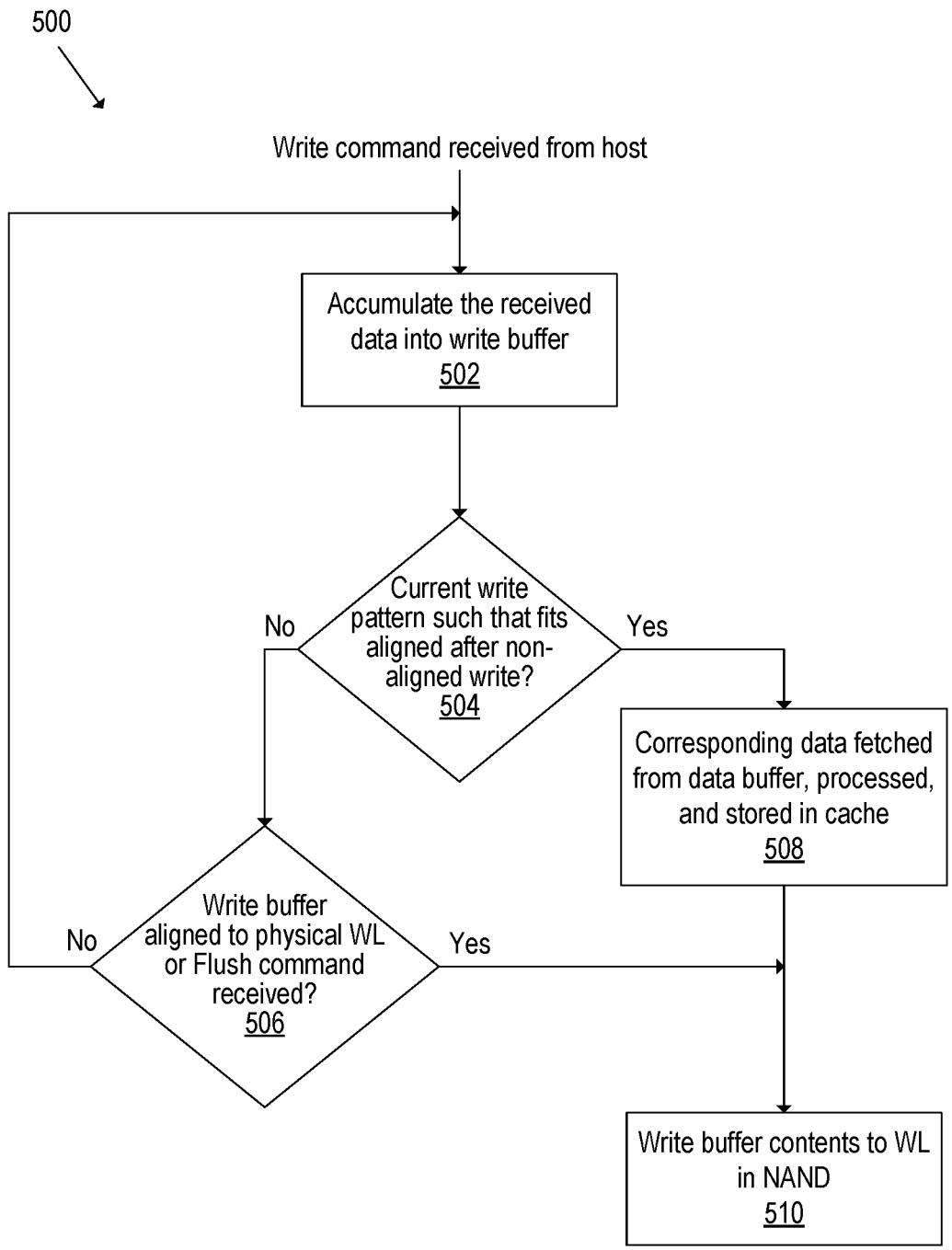
FIG. 5 is flowchart illustrating write operations for handling write commands according to another embodiment.

In a first embodiment, the identification system may be incorporated in existing systems in a manner described on FIG. 5. FIG. 5 is flowchart 500 illustrating write operations for handling write commands according to another embodiment.

A write command is received from the host device for operations for handling write commands according to one embodiment. In block 502, the write buffer will accumulate all the received data to then be written to the Jumbo WLs when there is enough data aggregated. The received data will be a combination of non-aligned data and aligned data. Next the write pattern is identified as aligned data or non-aligned data.

In block 504, the device determines if the data matches a case of "aligned after non-aligned" write. The case of "aligned after non-aligned" is the process done through analysis of the host command LBAs and inference of the command length. If an aligned data length is written after a short non-aligned write (and depending on the current status of the write buffer in the HAWA module) the issue can be detected. Once the issue has been detected by the write buffer there are two outcomes that follow. If the aligned data doesn't fit with aligned data on a Jumbo WL already received, then the process will continue to block 506. If the aligned data does fit on a Jumbo WL with the aligned data already received not including the non-aligned on said word line already received then the process will continue to block 508.

In block 506, the write buffer is aligned to determine whether the data is ready to be written to the physical WL of the NAND or if a flush command is received that specifically indicates to write all the non-written data sent by the host to the NAND regardless of the buffer state. If the data is not ready to be written then the process returns to block 502. If the data is ready to be written or if a flush command is received then the process proceeds to block 510 where the contents of the buffer is written to the WL in the NAND.

In block 508, the non-aligned data 206 and the aligned data 202, 204 is rearranged. The rearrangement is done by determining if the write command received contains non-aligned data 206 and non-aligned data 202, 204 that should have been aligned and, how much of the non-aligned data 206 and aligned data 202, 204 is to be written. Once the controller processes the information the data is then stored in the cache.

The goal of the module is to restructure the data so the data is written to the memory like the example in FIG. 6 discussed below, which can either be done by writing the short non-aligned data segment to a separate WL or waiting with further data accumulation while writing the aligned data segment.

Figure 6:
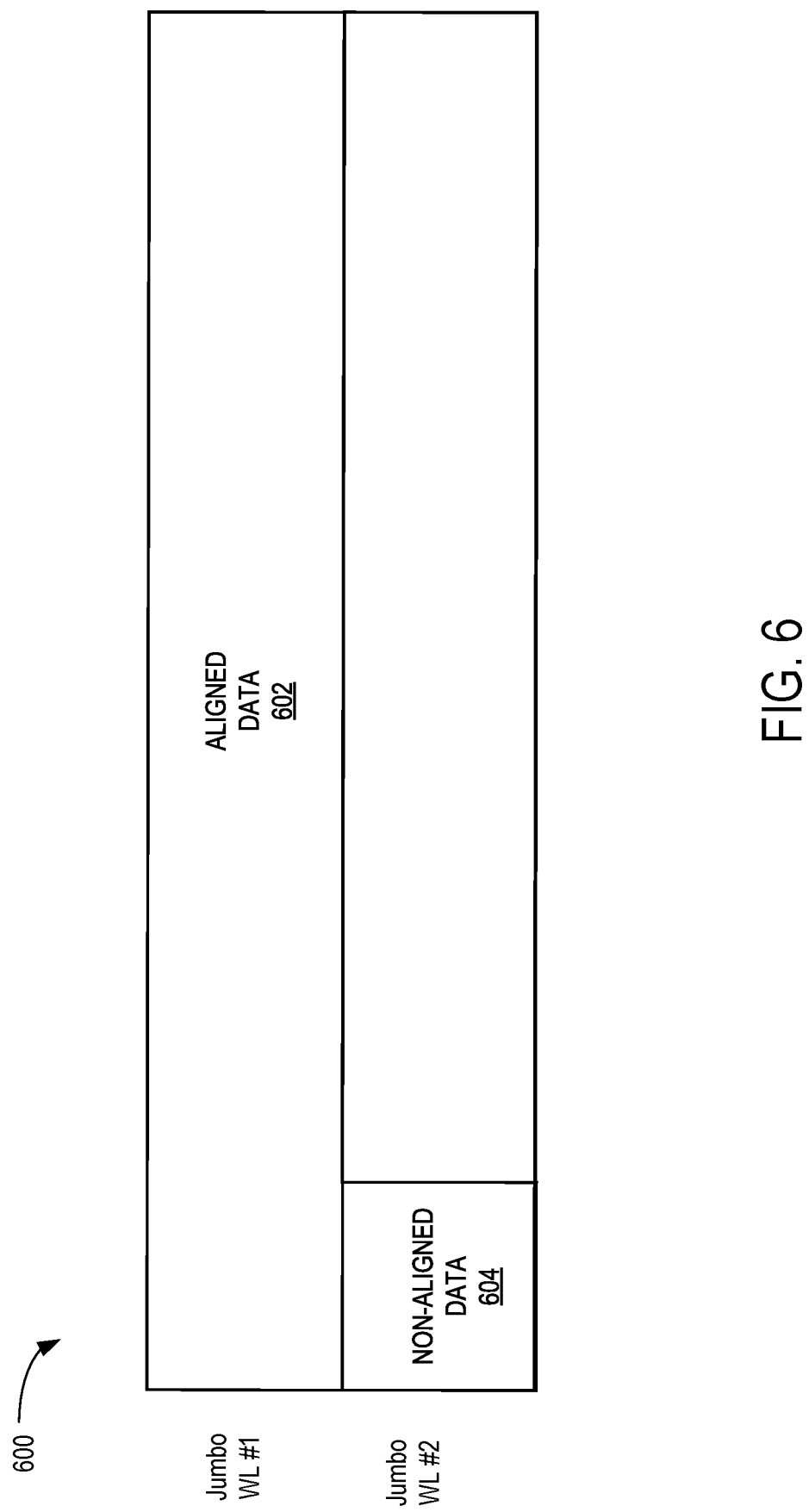
FIG. 6 is a schematic illustrations of data of two consecutive write commands written to jumbo WLs according to one embodiment.

FIG. 6 is a schematic illustration of data of two consecutive write commands written to jumbo WLs according to one embodiment. As described previously, the system has the option when instructed to write to the Jumbo WL to either write all the non-aligned data 206 and aligned data 202, 204 or to hold the non-aligned data 206 while the system waits for more data to accumulate and write the aligned data 202, 204 to a Jumbo word line. FIG. 6 shows the option where aligned data 202, 204 now being aligned data 602 is written entirely to Jumbo WL #1, which then leaves non-aligned data 206, now being non-aligned data 604, to be written to Jumbo WL #2, which is separate from Jumbo WL #1. The now aligned data 602 is fit into Jumbo WL #1 for higher QoS since the system only has to read the one Jumbo WL #1 opposed to if the aligned data was on both Jumbo WL #1 and Jumbo WL #2 forcing the system to read two separate WL's.

Figure 7:
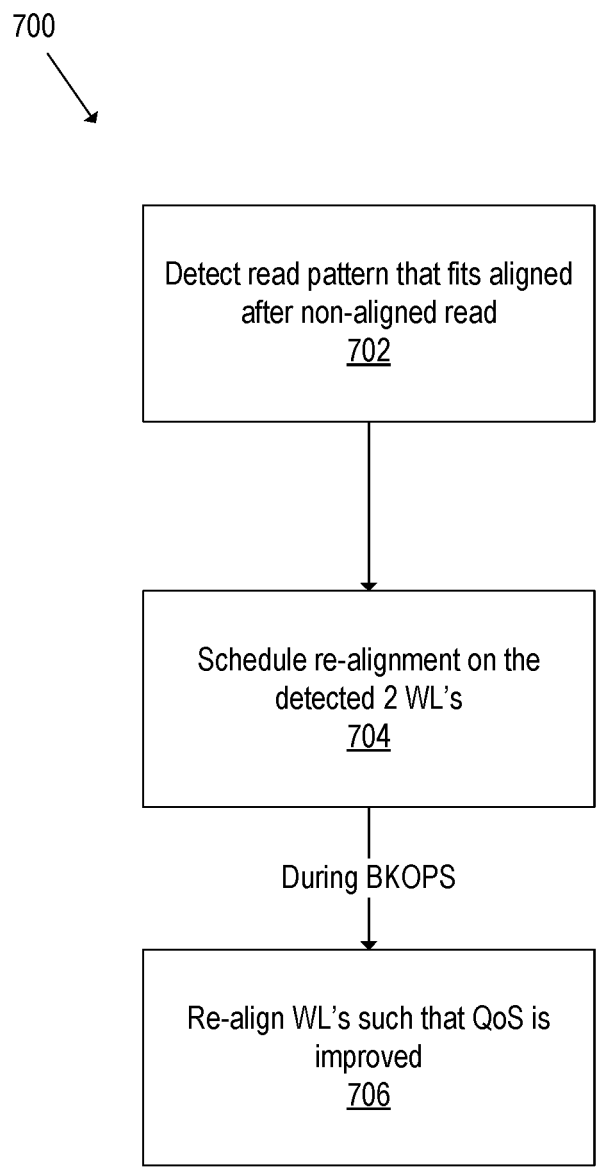
FIG. 7 is a flowchart illustrating read operations for identifying and handling non-aligned reads according to one embodiment.

In another embodiment, identification of such a problematic write pattern may be done after the data is written and read by the host. The block process is described in FIG. 7. FIG. 7 is a flowchart 700 illustrating read operations for identifying and handling non-aligned reads according to one embodiment.

In this embodiment if the host requests data that is aligned to a physical structure in size (WL or JWL) but it is translated into 2 (or more) physical structures in the system, such a request may be an indication that restructuring will improve the read QoS. The device detects a read pattern that fits aligned data after non-aligned data is read which the start of the process in block 702. In this case the controller then, at block 704, schedules a re-alignment on the detected problem in the two WL's. Furthermore, the re-alignment may be scheduled in block 704 to be performed during BKOPS (or in severe cases, during foreground operations).

In block 706, the mechanism that fixes the write pattern through re-alignment may be similar to garbage collection of these two WLs. Specifically, the mechanism involves reading both WLs, copying the unaligned data piece to a buffer that fits 1 WL, and writing the data to NAND. The rest of the read data that does not fit may be written separately or more data may be accumulated to be written later. The data that does not fit can be that of either non-aligned data or aligned data that did not fit in the WL or Jumbo WL.

In another embodiment, the issue can be identified in a similar manner on the read path, but treated differently. Instead of using the future BKOPS time, the re-alignment may occur "on-the-fly".

In low queue depth read mode, there is a small period of time (called HTAT) between the current read completion and the next command's interpretation that can be used for background operations.

It may be convenient to use this period of time to perform this re-alignment as all the data is present in the storage controller (as these are successive WLs).

Figure 8:
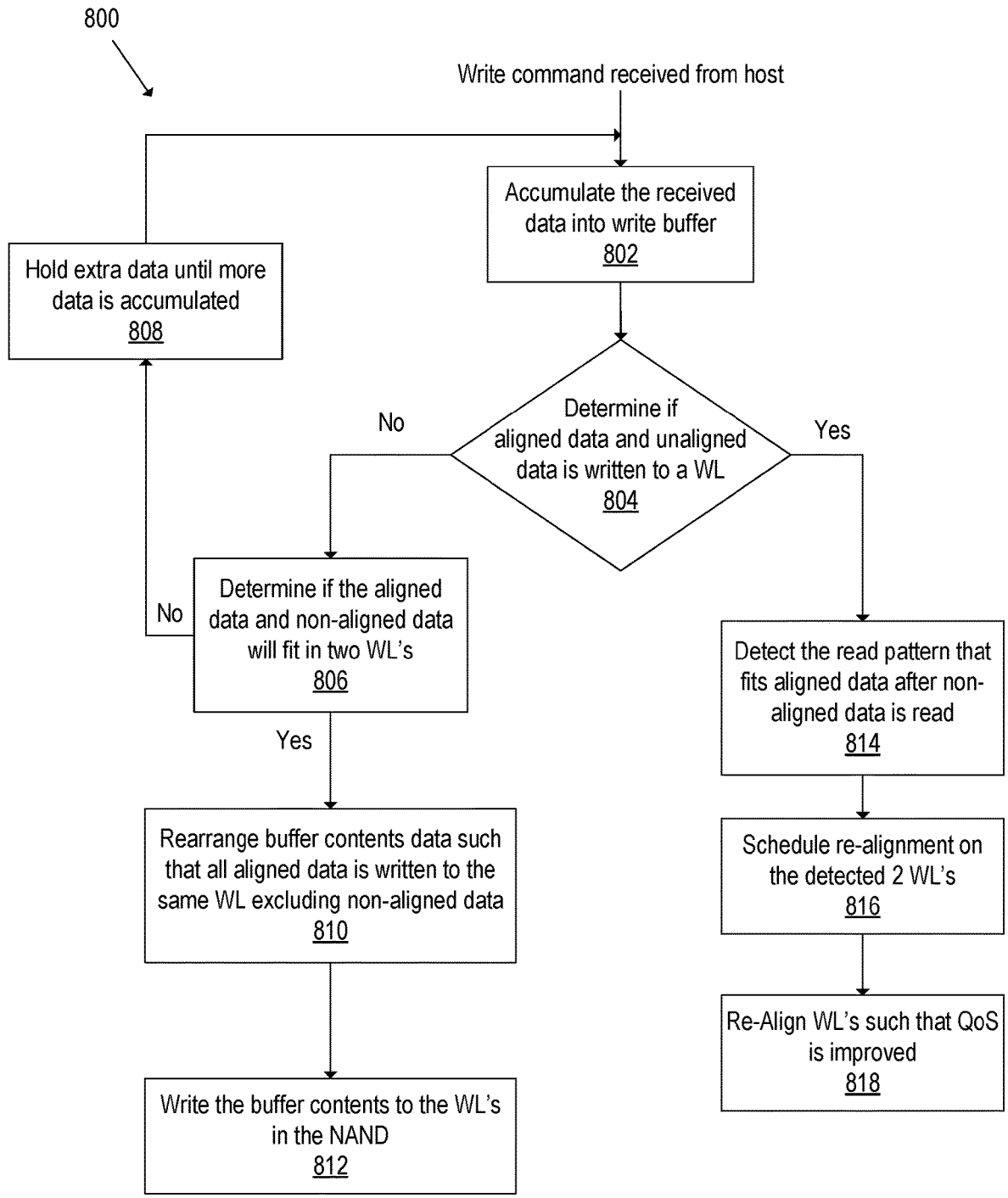
FIG. 8 is a flowchart illustrating ensuring aligned writes for aligned reads according to one embodiment.

FIG. 8 is a flowchart 800 illustrating ensuring aligned writes for aligned reads according to one embodiment. Initially, a write command is received from a host device and the data for the write command is accumulated in a write buffer at 802. A determination is made at 804 regarding whether non-aligned data and already aligned data is to be written to a common WL and hence, causing aligned data to be non-aligned. If no, then a determination is made at 806 regarding whether the aligned data and non-aligned data will fit on two WLs. If no, then at 808, the non-aligned data is held in the buffer and accumulated while the aligned data is written. If yes at 806, then the buffer contents are rearranged such that all the aligned data is written to the same WL excluding the non-aligned data at 810. Then, the buffer content of non-aligned data is written to a common WL at 812. If no at 804, then later, upon read the data, it may be determined at 814 that the read pattern reads data in a way that is non-aligned, but could be aligned if the data was re-aligned. The realignment is then scheduled at 816 and the data is realigned at 818 to improve QoS.

By detecting non-aligned data and holding the non-aligned data in a buffer, aligned data can be written for an efficient read operation. The non-aligned data can be held in the buffer until sufficient non-aligned data is accumulated to achieve alignment. Doing so will improve random read performance and quality of service (QoS) for systems that write aligned and non-aligned data, such as Windows primary drive and certain benchmarks. As such the improved writing enables more efficient read operations.

In one embodiment, a data storage device comprises: a memory device; and a controller coupled to the memory device, wherein the controller is configured to: accumulate data to be written to the memory device in a write buffer; determine whether a current write pattern fits aligned after non-aligned write; rearrange the data to align with a word line; and write the data to the memory device. The controller is further configured to: receive a first write command, wherein data associated with the first write command is non-aligned; and receive a second write command, wherein data associated with the second write command is aligned. The controller is further configured to write the data associated with the second write command to the memory device, and wherein the data associated with the first write command remains in the write buffer after writing the data associated with the second write command. The controller is further configured to write the data associated with the first write command to a different word line than the data associated with the second write command. The data associated with the first write command is written to the memory device after the data associated with the second write command is written to the memory device. The accumulating comprises accumulating sufficient data to be aligned. The controller is configured to write aligned data to the memory device upon determining that the data is aligned. An aligned write is a jumbo word line spanning multiple dies. The controller is further configured to detect a read pattern on two word lines and re-align data associated with the read pattern.

In another embodiment, a data storage device comprises: a memory device; and a controller coupled to the memory device, wherein the controller is configured to: detect a read pattern on two word lines that fits aligned after non-aligned read; schedule re-alignment on the two word lines; and re-align the two word lines on the memory device. The re-alignment is scheduled to occur during background operations (BKOPS). The re-alignment occurs during foreground operations upon reaching a threshold. The threshold is scheduling re-alignment of the two word lines two times prior to background operations (BKOPS) occurring. The re-aligning occurs between completion of a read operation associated with the detecting and a next command's interpretation. The re-aligning comprises retrieving data associated with the read operation from cache and storing the data in the memory device. The detecting comprises retrieving the data associated with the read operation from a first location in the memory device, and wherein storing the data in the memory device comprises storing the data in a second location distinct from the first location. The scheduling comprises determining whether to performing the re-aligning during background operations (BKOPS) or foreground operations.

In another embodiment, a data storage device comprises: memory means; and a controller coupled to the memory means, wherein the controller is configured to: determine that either a write pattern or a read pattern is not-aligned; re-align data associated with the write pattern or the read pattern; and write the re-aligned data to the memory means. For re-aligning data associated with the write pattern, data for write commands are written out of order of receipt. For re-aligning data associated with the read pattern, data for the read commands is written to the memory means from a buffer in between a read operation associated with the read pattern and processing a next command.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
accumulate data to be written to the memory device in a write buffer;
determine whether a current write pattern fits aligned after non-aligned write;
split the data into chunks where a small chunk of the chunks is non-aligned and another chunk is aligned;
rearrange the data to align with a word line; and
write the data to the memory device, wherein the small chunk is written later to ensure the another chunk remains aligned when written to the memory device.

2. A data storage device, comprising:
a memory device; and
a controller coupled to the memory device, wherein the controller is configured to:
accumulate data to be written to the memory device in a write buffer;
determine whether a current write pattern fits aligned after non-aligned write;
rearrange the data to align with a word line;
write the data to the memory device;
receive a first write command, wherein data associated with the first write command is non-aligned; and
receive a second write command, wherein data associated with the second write command is aligned.

3. The data storage device of claim 2, wherein the controller is further configured to write the data associated with the second write command to the memory device, and wherein the data associated with the first write command remains in the write buffer after writing the data associated with the second write command.

4. The data storage device of claim 2, wherein the controller is further configured to write the data associated with the first write command to a different word line than the data associated with the second write command.

5. The data storage device of claim 4, wherein the data associated with the first write command is written to the memory device after the data associated with the second write command is written to the memory device.

6. The data storage device of claim 1, wherein the accumulating comprises accumulating sufficient data to be aligned.

7. The data storage device of claim 1, wherein the controller is configured to write aligned data to the memory device upon determining that the data is aligned.

8. A data storage device, comprising:
a memory device; and
a controller coupled to the memory device, wherein the controller is configured to:
accumulate data to be written to the memory device in a write buffer;
determine whether a current write pattern fits aligned after non-aligned write;
rearrange the data to align with a word line;
write the data to the memory device,
wherein an aligned write is a jumbo word line spanning multiple dies.

9. The data storage device of claim 1, wherein the controller is further configured to detect a read pattern on two word lines and re-align data associated with the read pattern.

10. A data storage device, comprising:
a memory device; and
a controller coupled to the memory device, wherein the controller is configured to:
detect a read pattern on two word lines that fits aligned after non-aligned read;
schedule re-alignment on the two word lines; and
re-align the two word lines on the memory device.

11. The data storage device of claim 10, wherein the re-alignment is scheduled to occur during background operations (BKOPS).

12. The data storage device of claim 10, wherein the re-alignment occurs during foreground operations upon reaching a threshold.

13. The data storage device of claim 12, wherein the threshold is scheduling re-alignment of the two word lines two times prior to background operations (BKOPS) occurring.

14. The data storage device of claim 10, wherein the re-aligning occurs between completion of a read operation associated with the detecting and a next command's interpretation.

15. The data storage device of claim 14, wherein the re-aligning comprises retrieving data associated with the read operation from cache and storing the data in the memory device.

16. The data storage device in claim 15, wherein the detecting comprises retrieving the data associated with the read operation from a first location in the memory device, and wherein storing the data in the memory device comprises storing the data in a second location distinct from the first location.

17. The data storage device of claim 10, wherein the scheduling comprises determining whether to performing the re-aligning during background operations (BKOPS) or foreground operations.

18. A data storage device, comprising:
memory means; and
a controller coupled to the memory means, wherein the controller is configured to:
determine that either a write pattern or a read pattern is not-aligned;
split data into chunks where a small chunk of the chunks is non-aligned and another chunk is aligned;
re-align data associated with the write pattern or the read pattern; and
write the re-aligned data to the memory means, wherein the small chunk is written later to ensure the another chunk remains aligned when written to the memory means.

19. The data storage device of claim 18, wherein for re-aligning data associated with the write pattern, data for write commands are written out of order of receipt.

20. The data storage device of claim 18, wherein for re-aligning data associated with the read pattern, data for the read commands is written to the memory means from a buffer in between a read operation associated with the read pattern and processing a next command.

* * * * *